(12) United States Patent
Choi

(10) Patent No.: US 8,044,423 B2
(45) Date of Patent: Oct. 25, 2011

(54) LIGHT EMITTING DEVICE PACKAGE

(75) Inventor: Yong Seok Choi, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/792,589

(22) Filed: Jun. 2, 2010

(65) Prior Publication Data

US 2010/0237376 A1      Sep. 23, 2010

Related U.S. Application Data

(63) Continuation of application No. 12/146,292, filed on Jun. 25, 2008, now Pat. No. 7,755,099.

(30) Foreign Application Priority Data

Jun. 27, 2007 (KR) .......................... 10-2007-0063771

(51) Int. Cl.
*H01L 33/00* (2010.01)

(52) U.S. Cl. .................................. 257/98; 257/99; 63/12

(58) Field of Classification Search .................... 257/98, 257/99; 63/12
See application file for complete search history.

(56) References Cited

U.S. PATENT DOCUMENTS

| | | | |
|---|---|---|---|
| 5,546,496 A | 8/1996 | Kimoto et al. | |
| 6,476,410 B2 | 11/2002 | Ishinaga | |
| 6,878,971 B2 * | 4/2005 | Uemura | 257/98 |
| 7,389,026 B2 * | 6/2008 | Nagasaka | 385/39 |
| 7,906,794 B2 * | 3/2011 | Harrah et al. | 257/99 |
| 2005/0132747 A1 * | 6/2005 | Takemori et al. | 63/12 |
| 2007/0145403 A1 * | 6/2007 | Tomioka et al. | 257/99 |
| 2008/0019103 A1 * | 1/2008 | Kim | 361/720 |
| 2010/0102345 A1 * | 4/2010 | Kong et al. | 257/98 |

* cited by examiner

*Primary Examiner* — Phuc Dang

(74) *Attorney, Agent, or Firm* — Birch, Stewart, Kolasch & Birch, LLP

(57) ABSTRACT

Provided is a light emitting device package. The light emitting device package comprises a base substrate, a frame, and a light emitting device. The base substrate comprises a plurality of electrode pads. The frame is formed of silicon, attached on the base substrate, and has an opening. The light emitting device is electrically connected to the electrode pad in the opening.

16 Claims, 4 Drawing Sheets

LIGHT EMITTING DEVICE PACKAGE

CROSS-REFERENCE TO RELATED APPLICATIONS

The present application is a 37 C.F.R. §1.53(b) continuation of U.S. patent application Ser. No. 12/146,292, filed Jun. 25, 2008, now U.S. Pat. No. 7,755,099 issued on Jul. 13, 2010, which claims priority under 35 U.S.C. 119 to Korean Patent Application No. 10-2007-0063771, filed on Jun. 27, 2007, each of which is hereby incorporated by reference in its entirety.

BACKGROUND

A light emitting diode (LED) is a semiconductor device that can be realized as various light emitting sources using compound semiconductor materials such as GaAs, AlGaAs, GaN, InGaN, and AlGaInP.

The characteristics of the LED can be determined by a material, color, brightness, and the range of brightness intensity of a compound semiconductor. Also, the LED is packaged and is applied to various fields such as a lighted-on display representing color, a character display, and an image display.

SUMMARY

Embodiments provide a light emitting device package that attaches a silicon wafer on a metal substrate and allows a light emitting device to be mounted through an opening of the wafer, and a manufacturing method thereof.

Embodiments provide a light emitting device package that can cover the outer periphery of a light emitting device with a reflective frame formed of silicon, and a manufacturing method thereof.

An embodiment provides a light emitting device package comprising: a base substrate comprising a plurality of electrode pads; a frame formed of silicon, the frame being attached on the base substrate, and having an opening; and a light emitting device electrically connected to the electrode pad in the opening.

An embodiment provides a light emitting device package comprising: a base substrate formed of metal, comprising a plurality of electrode pads; a frame formed of silicon, the frame being attached on the base substrate, and comprising an opening whose lateral side is inclined; a light emitting device electrically connected to the electrode pads in the opening; and a resin material in the opening.

An embodiment provides a method for manufacturing a light emitting device package comprising: forming a plurality of openings in a silicon wafer; forming a pair of electrode pads corresponding to each opening on a base substrate; attaching the silicon wafer on the base substrate to dispose the pair of electrode pads in the opening; mounting a light emitting device on at least one of electrode pads; and dicing the base substrate and the silicon wafer comprising the light emitting device in package units.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
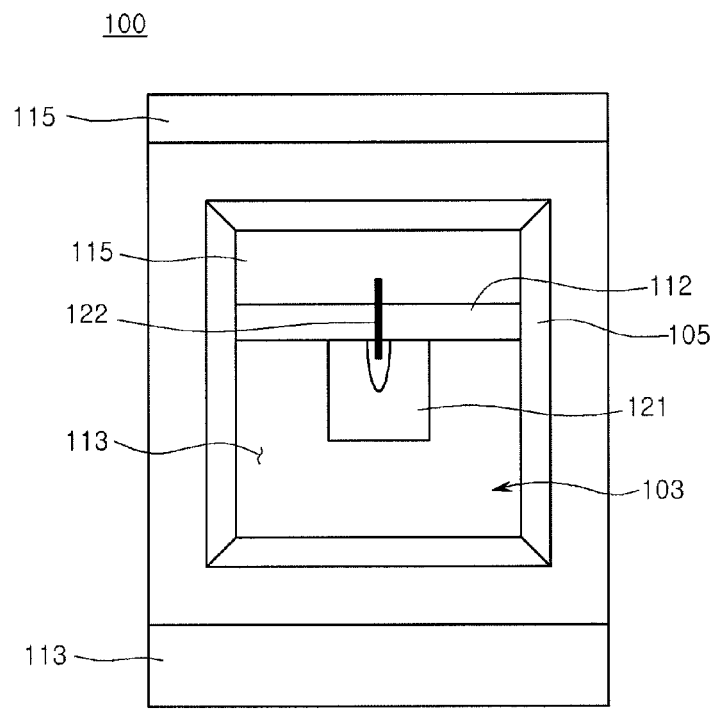
FIG. 1 is a plan view of a light emitting device package according to an embodiment.

FIG. 1 is a plan view of a light emitting device package according to an embodiment.

Figure 2:
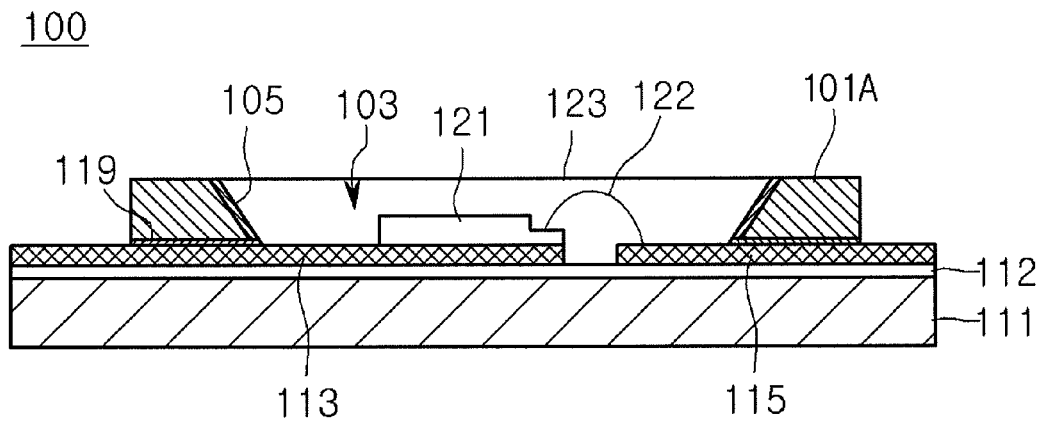
FIG. 2 is a side cross-sectional view of FIG. 1.

Referring to FIGS. 1 and 2, a light emitting device package 100 comprises a silicon frame 101A, a base substrate 111, electrode pads 113 and 115, and a light emitting diode 121.

The silicon frame 101A can comprise silicon and silicon carbide (SiC). When silicon is used, the frame can have a thinner thickness than that of ceramic frame. Also, the silicon frame is not deformed depending on temperature and time. That is, the silicon frame 101A has no shape deformation or color change at high temperature compared to a polyphthalamide (PPA) resin.

Referring to FIG. 2, the silicon frame 101A is attached on the base substrate 111. Here, an adhesive 119 is used between the silicon frame 101A and the base substrate 111. The adhesive 119 can comprise Ag paste or a polymer resin material such as epoxy.

An opening is formed in the silicon frame 101A. The opening 103 is a portion in which the light emitting diode 121 is disposed. The surface of the opening can be formed in a circular shape or a polygonal shape.

A lateral side 105 is formed around the opening 103. The lateral side is formed to be inclined by 91-160° to the outer direction with respect to the bottom to efficiently reflect incident light. Metal material having high light reflectivity, such as Ag and Al can be formed on the lateral side 105.

The base substrate 111 can comprise a substrate formed of metal such as aluminum oxide, copper, and tungsten having high thermal conductivity.

An insulating layer 112 can be formed on the base substrate 111. The insulating layer 112 can be selected from a resin material, $SiO_2$, $Si_3N_4$, $Al_2O_3$, and $TiO_2$.

The plurality of electrode pads 113 and 115 are formed in a land shape on the insulating layer 112. The plurality of electrode pads 113 and 115 are electrically open inside the opening 103 and exposed to both sides of the silicon frame 101A. In the case where a via hole (not shown) is formed in the base substrate 111, the plurality of electrode pads 113 and 115 can be electrically connected to the lower portion of the base substrate 111 through the via hole.

The light emitting device 121 is attached on at least one of the electrode pads 113 and 115 disposed in the opening 103 and electrically connected to the other electrode 115 using a wire 122. Here, in the case where the light emitting device 121 is a vertical semiconductor light emitting device, it can be attached on the electrode pad 113 using a conductive adhesive. In the case where the light emitting device 121 is a lateral semiconductor light emitting device, it can be connected to respective electrode pads using a plurality of wires. Also, the light emitting device 121 can be connected to the respective electrode pads 113 and 115 using a flip method. There is no limitation in the chip structure of the light emitting device 121, and a mounting method.

Also, at least one light emitting device 121 can be disposed in the opening 103. A color LED chip such as a blue LED chip, a green LED chip, a red LED chip, and a yellow LED chip, and an ultraviolet (UV) LED chip can be selectively mounted as the light emitting device 103. Here, the light emitting device 121 can be a compound semiconductor formed of a material such as GaAs, AlGaAs, GaN, InGaN, and AlGaInP.

A resin material 123 such as a transparent epoxy and silicon can be used as a molding in the opening 103 where the light emitting device 121 is disposed. Fluorescent material can be added to the resin material 123. For example, in the case where target light is white light for lighting or indication and the light emitting device 121 emits blue light, yellow fluorescent material can be added to the resin material 123. The yellow fluorescent material comprises but are not limited to YAG or yellow fluorescent material for silicate. A lens can be attached on the resin material.

The light emitting device package 100 is a chip-on-board (COB) type package, and has excellent heatsink performance and excellent light efficiency, so that it can be provided for use in a power package of 3 W or more.

FIGS. 3 to 6 are views illustrating a method for manufacturing a light emitting device package.

Figure 3:
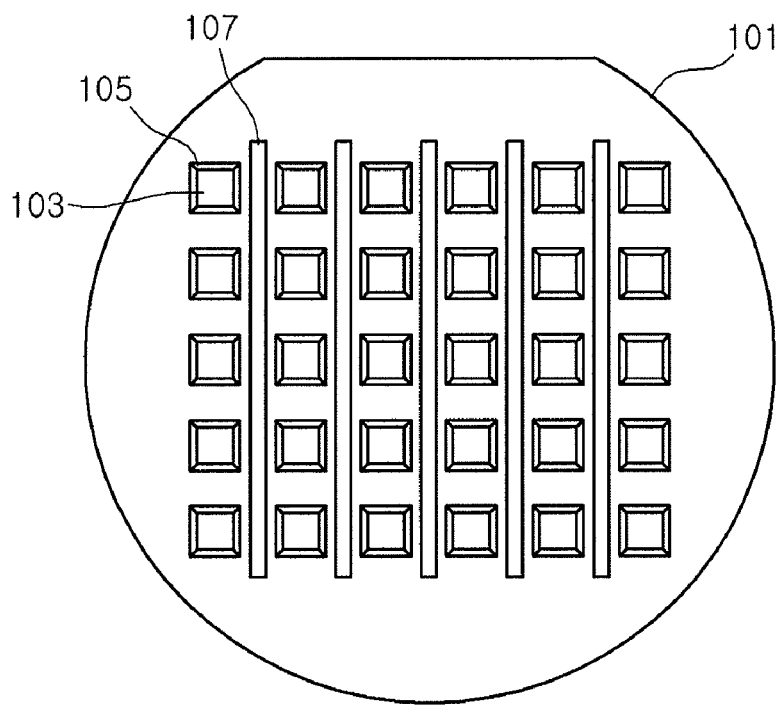
FIGS. 3 to 6 are views illustrating a method for manufacturing a light emitting device package.

FIG. 3 is a plan view illustrating the silicon frame of FIG. 1.

Referring to FIG. 3, the silicon wafer 101 is the silicon frame of FIG. 2, and can comprise a material such as silicon and silicon carbide (SiC). When silicon is used, the frame can have a thinner thickness (ex: minimum thickness of 150 μm) than that of ceramic frame. Also, the silicon frame is not deformed depending on temperature and time.

The silicon wafer 101 is a nonconductor of electricity having electrical conductivity of $10^{10}$ Ωcm or more, and can be formed of a material having high thermal conductivity of 140 W/mK or more.

The silicon wafer 101 comprises openings 103 and package boundary holes 107. The openings 103 are separated with a constant interval and arranged in a matrix configuration. The opening 103 can have a circular or polygonal surface, which can be formed through a semiconductor etching process.

The lateral side 105 of the opening 103 is inclined by a predetermined angle (ex: 90-160° C.) to the outer side with respect the bottom. Metal material (ex: Ag and Al) having high light reflectivity can be deposited on the lateral side 105.

Also, the package boundary holes 107 can be formed with a constant interval along the vertical direction and/or horizontal direction of the silicon wafer 101, and can change depending on the dicing direction of a unit package. The package boundary hole 107 separates the openings 103 to the left and right.

Figure 4:
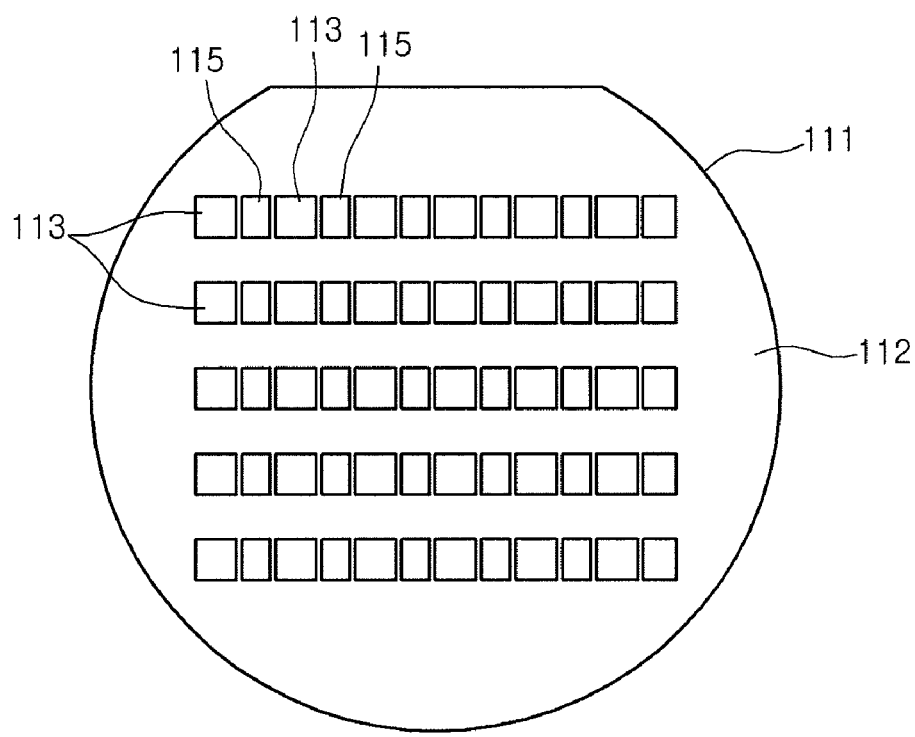

FIG. 4 is a plan view illustrating the base substrate of FIG. 1.

Referring to FIG. 4, the base substrate 111 can comprise a metal substrate formed of a material such as aluminum oxide, copper, and tungsten. The insulating layer 112 is formed on the base substrate 111. A pair of electrode pads 113 and 115 are formed on the insulating layer 112.

The pair of electrode pads 113 and 115 are open, respectively, to correspond to the openings 103 (of FIG. 2), and are realized in a land pattern. The electrode pads 113 and 115 are formed with a constant interval from the left to the right direction. One of the electrodes 113 and 115 is formed in a larger size to allow a light emitting device to be disposed thereon.

Figure 5:
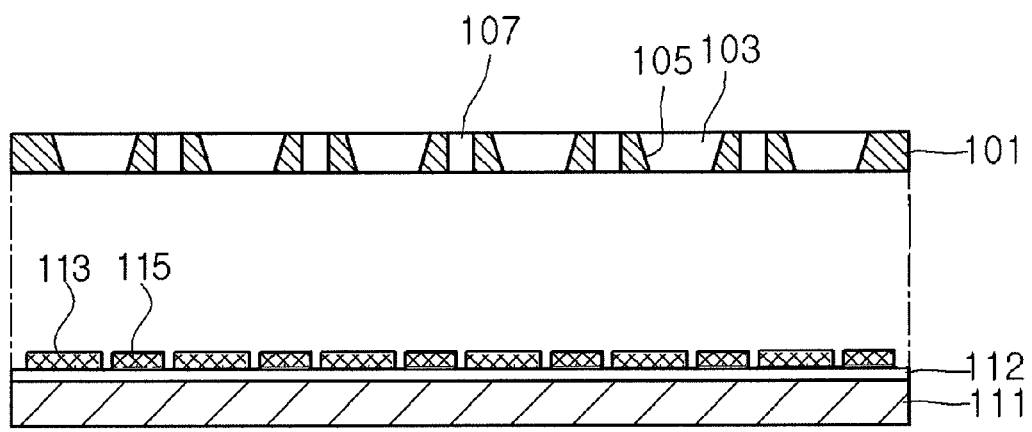
Figure 6:
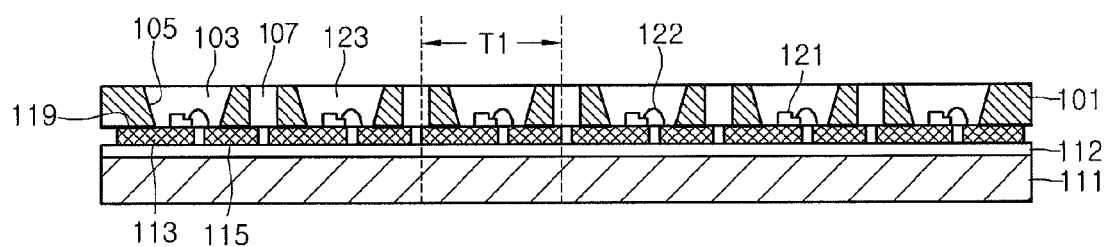

FIG. 5 is an exploded perspective view of a silicon wafer disposed on a base substrate, and FIG. 6 is a side cross-sectional view illustrating a light emitting device is mounted after a silicon wafer is attached on a base substrate.

Referring to FIG. 5, the silicon wafer 101 is disposed in the upper portion, and the base substrate 111 is disposed in the lower portion, and then they are aligned such that the openings 103 are disposed on the plurality of electrode pads 113 and 115. Also, the package boundary hole 107 is disposed between the electrode pads 113 and 115 forming a pair.

Referring to FIGS. 5 and 6, an adhesive 119 is coated on the electrode pads 113 and 115 of the base substrate 111. The adhesive 119 can comprise an Ag adhesive material or a polymer resin material such as epoxy. The lower surface of the silicon wafer 101 is attached on the base substrate 111. At this point, the bottom of the opening 103 is disposed such that the pair of electrode pads 113 and 115 are electrically open.

The light emitting device 121 is attached on one of the electrode pads 113 and 115 of the base substrate 111 disposed in the opening 103 using a conductive adhesive, and connected to the other pad 115 using a wire 122. Here, the light emitting device 121 comprises but is not limited to an LED chip manufactured using a compound semiconductor formed of GaAs, AlGaAs, GaN, InGaN, and AlGaInP. Also, the light emitting device 121 can comprise one or more LED chips, for example, or one or more red/green/blue LED chips for a lighting purpose. The light emitting device 121 can be mounted on the electrode pads 113 and 115 using a wire or flip bonding, and is not limited thereto.

Also, at least one light emitting device 121 can be disposed in the opening 103 and is not limited thereto.

The light emitting device 121 is mounted on the base substrate 111 in a COB type, so that it has excellent heatsink performance and excellent light efficiency. Accordingly, the light emitting device 121 can be provided for use in a power package of 3 W or more.

The resin material 123 is formed in the opening 103. At this point, the resin material 123 comprises a transparent silicon or epoxy. YAG or yellow fluorescent material for silicate can be added to the resin material. For example, yellow fluorescent material can be added to the resin material 123 to excite blue light into yellow light and emit the same.

After that, the silicon wafer 101 is diced in respective package units T1 using the package boundary holes 107, so that individual LED package 100 can be obtained as illustrated in FIGS. 1 and 2.

Since an outer frame formed of silicon is used for the LED package, a thinner package can be manufactured in comparison with using a ceramic material. Also, since the outer frame formed of silicon is used, limitations by a shape and color can be complemented and thus reliability of the package improves.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a base substrate;
a light emitting device on the base substrate;
a plurality of electrode pads on the base substrate, the plurality of electrode pads electrically connected to the light emitting device;
a frame having an opening on the base substrate; and
a layer comprising silver and disposed between the frame and the plurality of electrode pads,
wherein a size of an upper surface of the base substrate is larger than that of the frame so as for the frame to be disposed on the base substrate, and
wherein the layer comprising silver directly contacts the frame.

2. The light emitting device package according to claim 1, wherein the base substrate has a via hole.

3. The light emitting device package according to claim 1, further comprising a molding material formed in the frame.

4. The light emitting device package according to claim 1, wherein the frame includes silicon or silicon carbide.

5. The light emitting device package according to claim 1, wherein bottom surfaces of the plurality of electrode pads are on the base substrate and do not extend on lateral sides of the base substrate.

6. The light emitting device package according to claim 1, wherein the plurality of the electrode pads and the base substrate are coterminous at the lateral sides of the base substrate.

7. The light emitting device package according to claim 1, wherein the layer comprising silver is an adhesive layer.

8. A light emitting device package comprising:
a base substrate;
a light emitting device on the base substrate;
a plurality of electrode pads on the base substrate; and
a frame disposed on the base substrate,
wherein a size of an upper surface of the base substrate is larger than a size of the frame so as for the frame to be disposed on the base substrate,
all bottom surfaces of the plurality of electrode pads are substantially parallel to a top surface of the base substrate, and
the plurality of the electrode pads and the base substrate are coterminous at the lateral sides of the base substrate.

9. The light emitting device package according to claim 8, wherein a portion of a surface of the plurality of electrode pads is exposed to an outer side of the frame.

10. The light emitting device package according to claim 8, further comprising a layer including silver and disposed on a portion of plurality of electrode pads.

11. The light emitting device package according to claim 8, further comprising a molding material formed in the frame.

12. The light emitting device package according to claim 8, wherein the frame includes silicon or silicon carbide.

13. A light emitting device package comprising:
a base substrate;
a light emitting device on the base substrate;
a plurality of electrode pads on the base substrate, the plurality of electrode pads electrically connected to the light emitting device; and
a frame disposed on the base substrate,
wherein a size of an upper surface of the base substrate is larger than a size of the frame so as for the frame to be disposed on the base substrate,
a portion of at least one of the plurality of electrode pads formed outside the frame is emerged through a bottom of the frame and is parallel to the base substrate, and
the plurality of the electrode pads and the base substrate are coterminous at the lateral sides of the base substrate.

14. The light emitting device package according to claim 13, wherein the frame includes silicon or silicon carbide.

15. The light emitting device package according to claim 13, further comprising a layer including silver and disposed on a portion of the plurality of electrode pads.

16. The light emitting device package according to claim 13, further comprising a molding material formed in the frame.

* * * * *